(12) United States Patent
Albaugh et al.

(10) Patent No.: US 9,351,398 B2
(45) Date of Patent: May 24, 2016

(54) THICK FILM CONDUCTIVE INKS FOR ELECTRONIC DEVICES

(71) Applicant: GM Global Technology Operations LLC, Detroit, MI (US)

(72) Inventors: Lisa M. Albaugh, Frankfort, IN (US); David A. Smith, Kokomo, IN (US); Timothy J. Guse, Peru, IN (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 335 days.

(21) Appl. No.: 13/857,011

(22) Filed: Apr. 4, 2013

(65) Prior Publication Data
US 2014/0302333 A1 Oct. 9, 2014

(51) Int. Cl.
C09D 11/52 (2014.01)
C09D 11/037 (2014.01)
H05K 1/09 (2006.01)
H05K 3/12 (2006.01)

(52) U.S. Cl.
CPC .............. *H05K 1/095* (2013.01); *C09D 11/037* (2013.01); *C09D 11/52* (2013.01); *H05K 3/1291* (2013.01); *H05K 3/1233* (2013.01); *Y10T 428/31678* (2015.04)

(58) Field of Classification Search
None
See application file for complete search history.

(56) References Cited

U.S. PATENT DOCUMENTS

| | | | |
|---|---|---|---|
| 4,122,232 A | 10/1978 | Kuo | |
| 4,172,919 A | 10/1979 | Mitchell | |
| 4,322,316 A * | 3/1982 | Provance et al. | 252/512 |
| 4,388,347 A | 6/1983 | Shum et al. | |
| 4,521,329 A | 6/1985 | Siuta et al. | |
| 4,816,615 A | 3/1989 | Prabhu et al. | |
| 4,868,034 A | 9/1989 | Steinberg | |
| 4,986,933 A * | 1/1991 | Asada et al. | 252/520.1 |
| 6,207,288 B1 | 3/2001 | Bloom | |
| 7,470,380 B2 | 12/2008 | Mears | |
| 2004/0191690 A1 * | 9/2004 | Hayakawa | G03F 7/0047 430/277.1 |
| 2004/0245508 A1 | 12/2004 | Wang et al. | |
| 2005/0277550 A1 | 12/2005 | Brown et al. | |

OTHER PUBLICATIONS

German Patent and Trade Mark Office, Office Action in German Patent Application No. 10 2014 204 729.3 mailed Nov. 9, 2015.
State Intellectual Property Office of the People'S Republic of China, Office Action in Chinese Patent Application No. 201410134696.7 mailed Dec. 21, 2015.

* cited by examiner

*Primary Examiner* — Sheeba Ahmed
(74) *Attorney, Agent, or Firm* — Ingrassia Fisher & Lorenz, P.C.

(57) ABSTRACT

Thick film conductive inks for electronic devices, methods for making electronic devices using thick film conductive inks, and electronic devices fabricated by such methods are provided herein. In one example, a thick film conductive ink includes an organic portion and an inorganic portion. The inorganic portion is dispersed in the organic portion to define a paste. The inorganic portion includes metallic copper powder, cupric oxide, and elemental boron. The thick film conductive ink includes substantially no glass.

19 Claims, 2 Drawing Sheets

THICK FILM CONDUCTIVE INKS FOR ELECTRONIC DEVICES

TECHNICAL FIELD

The technical field generally relates to electronic devices, and more particularly relates to thick film conductive inks for electronic devices, methods for making electronic devices using thick film conductive inks, and electronic devices fabricated by such methods.

BACKGROUND

Thick film conductors are commonly used in the electronics industry and are of increasing importance as trends progress towards smaller and smaller circuits. Thick film conductors can be formed, for example, by screen printing a thick film conductive ink that is formulated with a powdered base metal onto a non-conductive substrate such as 96% alumina The thick film conductive ink is then dried to volatilize vehicle constituents and fired to sinter or fuse the powdered base metal and other remaining constituents to bond the film to the substrate.

Previously, thick film conductive inks typically included precious metals such as gold, silver, platinum, and palladium as the powdered base metal. More recently, in efforts to reduce cost, thick film conductive inks containing copper powder have been introduced into the market. Such thick film conductive inks also contain glass as an adhesion promoter that becomes soft when heated to temperatures suitable for sintering the copper powder, e.g., 675° C. or greater, to fuse the thick film conductor to the substrate. Unfortunately, glass is more resistive and can contain lead which is environmentally objectionable.

Accordingly, it is desirable to provide thick film conductive inks without glass for electronic devices, for example, to eliminate the presence of lead in the film or make the ink less resistive, methods for making electronic devices using such thick film conductive inks, and electronic devices fabricated by such methods. Moreover, it is desirable to provide thick film conductive inks with reduced cost for electronic devices, methods for making electronic devices using such thick film conductive inks, and electronic devices fabricated by such methods. Furthermore, other desirable features and characteristics of the present invention will become apparent from the subsequent detailed description and the appended claims, taken in conjunction with the accompanying drawings and the foregoing technical field and background.

BRIEF SUMMARY

A thick film conductive ink for an electronic device is provided herein. In one embodiment, the thick film conductive ink includes an organic portion and an inorganic portion. The inorganic portion is dispersed in the organic portion to define a paste. The inorganic portion includes metallic copper powder, cupric oxide, and elemental boron. The thick film conductive ink includes substantially no glass.

A method for making an electronic device is provided herein. In one embodiment, the method includes depositing a thick film conductive ink overlying a substrate. The thick film conductive ink includes an organic portion and an inorganic portion. The inorganic portion is dispersed in the organic portion to define a paste. The inorganic portion includes metallic copper powder, cupric oxide, and elemental boron. The thick film conductive ink includes substantially no glass. The thick film conductive ink is fired to form a conductor overlying the substrate.

An electronic device is provided herein. In one embodiment, the electronic device includes a substrate and a conductor that overlies the substrate. The conductor includes fused/sintered metallic copper, cupric oxide, boron trioxide, and substantially no glass.

BRIEF DESCRIPTION OF THE DRAWINGS

The exemplary embodiments will hereinafter be described in conjunction with the following drawing figures, wherein like numerals denote like elements, and wherein.

DETAILED DESCRIPTION

The following detailed description is merely exemplary in nature and is not intended to limit the application and uses. Furthermore, there is no intention to be bound by any theory presented in the preceding technical field, background, brief summary or the following detailed description.

Various embodiments contemplated herein relate to thick film conductive inks for electronic devices, methods for making electronic devices using thick film conductive inks, and electronic devices fabricated by such methods. The exemplary embodiments taught herein provide a thick film conductive ink that includes an organic portion and an inorganic portion. The inorganic portion includes metallic copper powder, cupric oxide, elemental boron, and substantially no glass. The term "substantially no glass" as used herein means glass, if present, is not used in an amount that measurably promotes adhesion of the film to a substrate (e.g., during and/or subsequent to firing the thick film conductive ink). The organic portion is, for example, an organic liquid, and the inorganic portion is dispersed in the organic portion to form a paste. In an exemplary embodiment, the thick film conductive ink is deposited, e.g., via screen printing, overlying a substrate. The thick film conductive ink is dried, and then fired, for example in a furnace, to form a conductor overlying the substrate. The conductor includes fused/sintered metallic copper, cupric oxide, boron trioxide, and substantially no glass. It has been found that during firing, the elemental boron that is present in the thick film conductive ink reacts with available oxygen from, for example, the cupric oxide and/or residual oxygen in the furnace atmosphere, to form boron trioxide. Boron trioxide promotes adhesion of the film to the substrate. As such, the thick film conductive ink and the subsequently formed conductor contain copper as a relatively low cost base metal without the presence of glass or lead.

Figure 1:
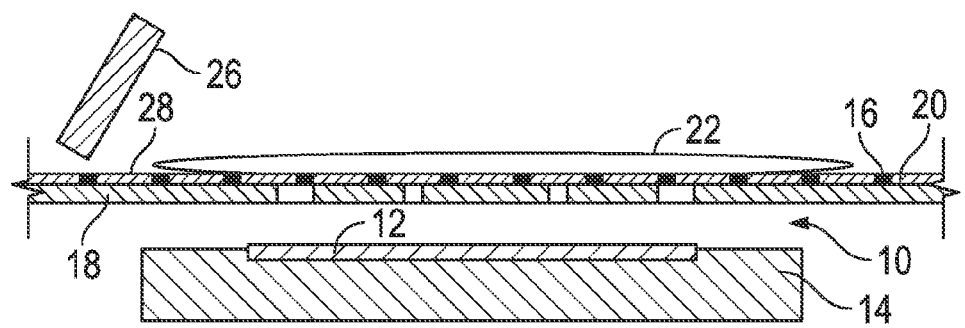
FIGS. 1-3 are cross-sectional views of an electronic device during various fabrication stages and a method for making the electronic device in accordance with an exemplary embodiment.

FIG. 1 illustrates, in cross-sectional view, the electronic device 10 during an early fabrication stage in accordance with an exemplary embodiment. As illustrated, the electronic device 10 includes a substrate 12. The substrate 12 can be, for example, a ceramic substrate containing alumina such as containing from about 94 to about 96 weight % (wt. %) alumina, silicon nitride, aluminum nitride, or alternatively a metallic substrate containing for example stainless steel or other metals with a relatively high melting point. Other substrates for electronic devices known to those skilled in the art may also be used.

The substrate 12 is positioned on a fixture 14 that is disposed underneath a screen mesh 16. A patterned emulsion 18 is disposed along the screen mesh 16 to define a patterned screen 20 for screen printing. Disposed overlying the patterned screen 20 is a thick film conductive ink 22. The thick film conductive ink 22 has an organic portion such as an organic liquid and an inorganic portion that is dispersed in the organic portion to define a paste.

The inorganic portion includes metallic copper powder, cupric oxide, elemental boron, and substantially no glass. In an exemplary embodiment, the inorganic portion consists essentially of metallic copper powder, cupric oxide, and elemental boron. As such, the inorganic portion includes substantially no lead. In an exemplary embodiment, the metallic copper powder is present in an amount of from about 65 to about 85 wt. % of the thick film conductive ink 22, the cupric oxide is present in an amount of from about 3 to about 23 wt. % of the thick film conductive ink 22, and the elemental boron is present in an amount of from about 0.5 to about 5 wt. of the thick film conductive ink.

In one embodiment, the metallic copper powder has a median particle size of from about 0.01 to about 10.5 μm and a surface area of from about 0.4 to about 2.5 m$^2$/g. In one example, the metallic copper powder includes one or more different types of copper powders including: Cu powder of deagglomerated coated fine particles having a surface area of from about 0.4 to about 0.75 m$^2$/g such as less than about 0.64 m$^2$/g, and a median particle size of from about 4.5 to about 10.5 μm such as less than about 6.65 μm; Cu powder of submicron crystalline particles having a surface area of from about 1.5 to about 2.5 m$^2$/g such as less than about 1.85 m$^2$/g, and a median particle size of from about 0.5 to about 0.9 μm such as less than about 0.65 μm; Cu powder of mono-dispersed particles having a surface area of from about 0.3 to about 0.8 m$^2$/g such as less than about 0.5 m$^2$/g, and a median particle size of from about 0.01 to about 2 μm such as less than about 2 μm; and/or Cu powder having a surface area of from about 0.8 to about 1.5 m$^2$/g such as less than about 1 m$^2$/g, and a median particle size of from about 1 to about 2 μm such as about 1.5 μm.

In an exemplary embodiment, the organic portion of the thick film conductive ink 22 is present in an amount of from about 10 to about 30 wt. % of the thick film conductive ink 22. As such, the inorganic portion is present in an amount of from about 70 to about 90 wt. % of the thick film conductive ink 22.

In an exemplary embodiment, the organic portion of the thick film conductive ink 22 includes an organic liquid having a boiling point of from about 220 to about 300° C., such as from 240 to about 260° C. at 1 atmosphere of pressure. Non-limiting examples of suitable organic liquids include 2,2,4-trimethyl-1,3-pentanediol monoisobutyrate (e.g., Texanol™), diethyl phthalate, alpha-Terpineol, butyl diglyme, or combinations thereof Additionally, the organic portion can include a rheological additive to increase the rheological properties of the organic liquid. In one example, the organic portion includes ethyl cellulose as a rheological additive. In an exemplary embodiment, the organic portion of the thick film conductive ink 22 includes 2,2,4-trimethyl-1,3-pentanediol monoisobutyrate present in an amount of from about 8 to about 25 wt. % of the thick film conductive ink 22, ethyl cellulose present in an amount of from about 0.5 to about 3 wt. % of the thick film conductive ink 22, and butyl diglyme present in an amount of from about 1 to about 4 wt. % of the thick film conductive ink 22. Organic portion of the thick film conductive ink 22 can include other organic additives known to those skilled in the art.

Figure 2:
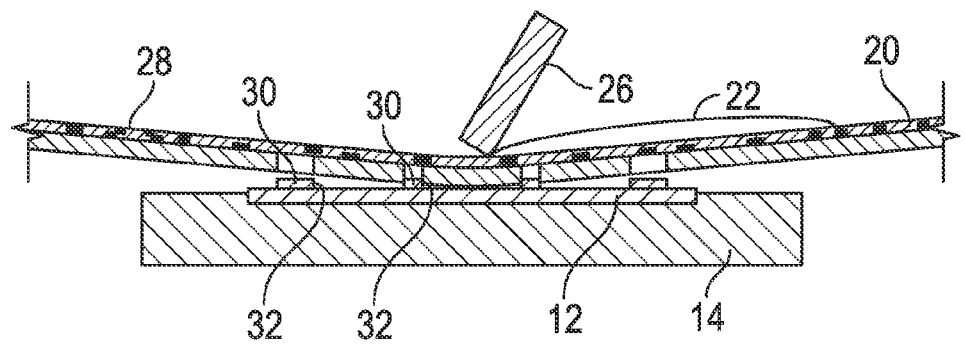

Referring to FIGS. 1-2, a squeegee 26 is advanced along an upper surface 28 of the patterned screen 20 to push the thick film conductive ink 22 through the patterned screen 20 to deposit the thick film conductive ink 22 overlying the substrate 12. As illustrated, the thick film conductive ink 22 that is deposited onto the substrate 12 forms a conductor paste layer 30 that defines discrete conductor paste features 32. The discrete conductor paste features 32 may be configured to form a thick film trace(s), thick film heat spreader(s), electronic device feature(s), and/or the like.

Figure 3:
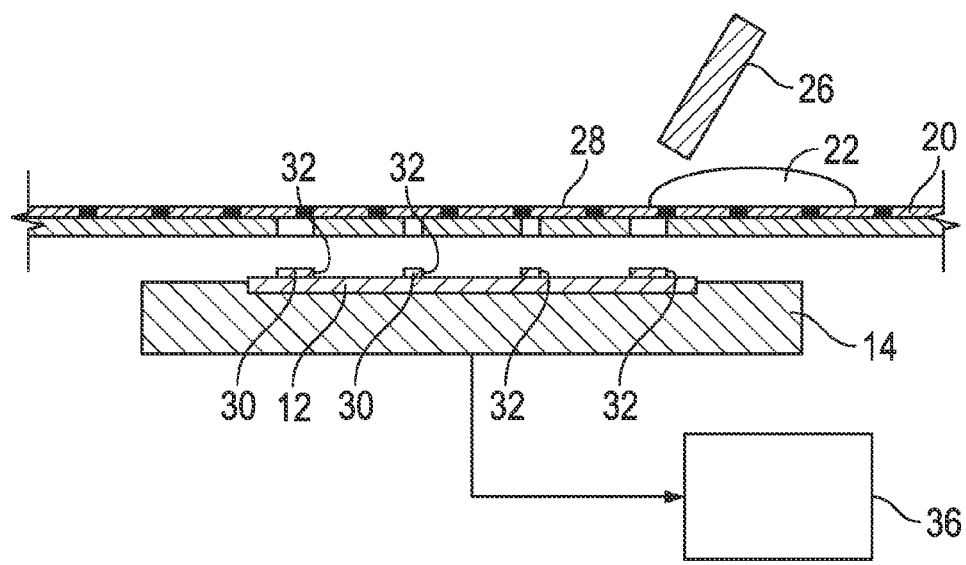

FIG. 3 illustrates, in cross-sectional view, the electronic device 10 during a further advanced fabrication stage in accordance with an exemplary embodiment. After the squeegee 26 has been advanced along the upper surface 28 of the patterned screen 20, for example, in a single pass, the conductor paste layer 30 is dried to remove volatile constituents, e.g., the organic portion of the thick film conductive ink 22. In an exemplary embodiment, the conductor paste layer 30 is dried by exposing the electronic device 10 to a temperature of from about 100 to about 150° C. for a time of from about 15 to about 30 minutes to remove at least a substantial portion of the volatile constituents.

The conductor paste layer 30 is then fired (step 36), for example, by positioning the electronic device 10 in a furnace and exposing the electronic device 10 to a furnace temperature for a predetermined time. In an exemplary embodiment, the furnace temperature is about 675° C. or greater, such as from about 800 to about 900° C., for example from about 850 to about 875° C., and the predetermined time is from about 30 to about 60 minutes.

Figure 4:
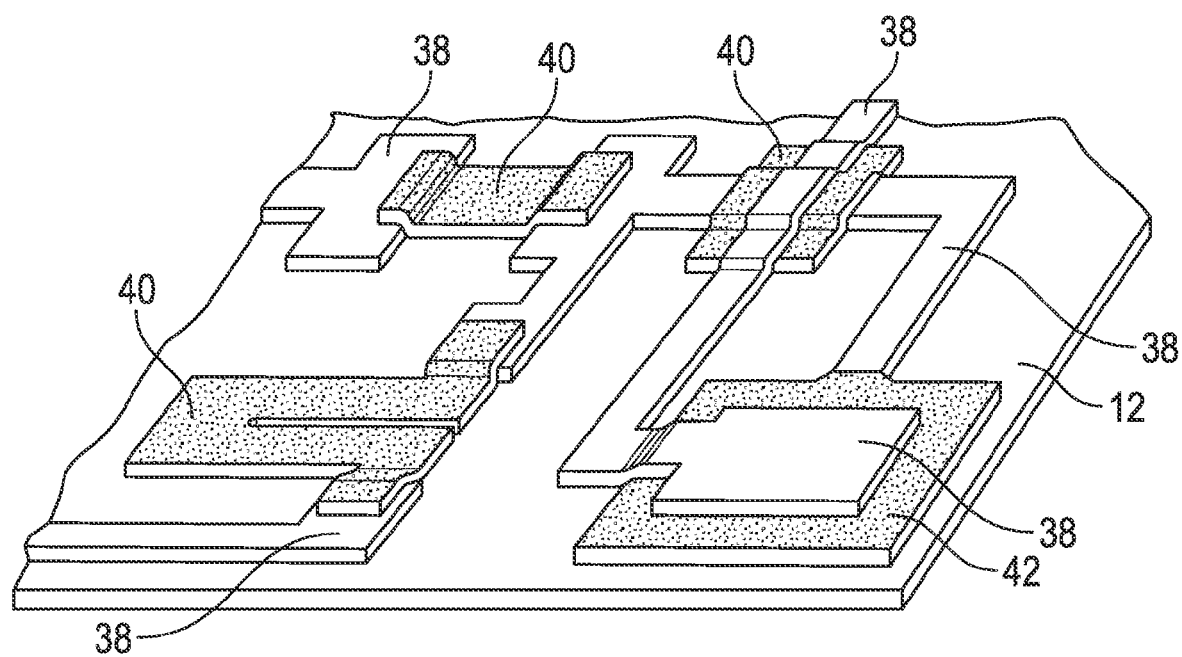
FIG. 4 is a perspective view of an electronic device in accordance with an exemplary embodiment.

Referring also to FIG. 4, during firing 36, the conductor paste layer 30 is sintered or fused together and affixed or adhered to the substrate 12 to form a conductor(s) 38. In particular, the elemental boron acts as an oxidation inhibitor and reacts with residual oxygen from the furnace atmosphere and/or cupric oxide to form boron trioxide. The metallic copper powder, cupric oxide, and the boron trioxide are fused or sintered together to form the conductor 38. In an exemplary embodiment, the conductor 38 includes fused/sintered metallic copper, cupric oxide, boron trioxide, and substantially no glass. Additionally, the conversion of elemental boron to boron trioxide promotes adhesion between the conductor 38 and the substrate 12. In an exemplary embodiment, the furnace atmosphere is a nitrogen-rich atmosphere having from about 5 to about 10 ppm of oxygen.

As illustrated in FIG. 4, the conductor(s) 38 may be configured as thick film traces, heat spreaders, or the like that are in direct contact with other features 40 and/or the substrate 12, for example, and/or spaced apart from the substrate 12 by a dielectric layer 42. In an exemplary embodiment, the conductor(s) 38 has a thickness of from about 0.02542 about 0.1524 mm that, for example, is a result of firing 36 of the single conductor paste layer 30 (see FIG. 3).

The following are examples of thick film conductive inks in accordance with various exemplary embodiments. The examples are provided for illustration purposes only and are not meant to limit the various embodiments of the thick film conductive inks in any way. All materials are set forth in weight percent.

EXAMPLES

THICK FILM CONDUCTIVE INK COMPOSITIONS

Thick film conductive ink - Formulation 1
(Theoretical Yield)

| Ingredient | Wt. % |
|---|---|
| Inorganic Portion | |
| Cu powder - (Base*, #1**, #2***, or #3****) | 50 to 85 (e.g., about 68) |
| CuO | 3 to 23 (e.g., about 7.69) |
| Elemental B | 0.5 to 5 (e.g., about 1.15) |
| Organic Portion | |
| Texanol ™ | 8 to 25 (e.g., about 19.62) |
| Butyl Diglyme | 1 to 4 (e.g., about 2.31) |
| Ethyl Cellulose | 0.5 to 3 (e.g., 1.15) |
| Total | 100.0 |

*Cu powder (Base) - deagglomerated coated fine particles; surface area of from about 0.4 to about 0.75 $m^2/g$ such as less than about 0.64 $m^2/g$; median particle size of from about 4.5 to about 10.5 μm such as less than about 6.65 μm.
**Cu powder (Option #1) - submicron crystalline particles; surface area of from about 1.5 to about 2.5 $m^2/g$ such as less than about 1.85 $m^2/g$; median particle size of from about 0.5 to about 0.9 μm such as less than about 0.65 μm.
***Cu powder (Option #2) - mono-dispersed particles; surface area of from about 0.3 to about 0.8 $m^2/g$ such as less than about 0.5 $m^2/g$; median particle size of from about 0.01 to about 2 μm such as less than about 2 μm.
****Cu powder (Option #3) - surface area of from about 0.8 to about 1.5 $m^2/g$ such as less than about 1 $m^2/g$; median particle size of from about 1 to about 2 μm such as about 1.5 μm.

Thick film conductive ink - Formulation 2
(Theoretical Yield)

| Ingredient | Wt. % |
|---|---|
| Inorganic Portion | |
| Cu powder (Base*) | 25 to 50 (e.g., 38) |
| Cu powder #3**** | 25 to 50 (e.g., 38) |
| CuO | 3 to 23 (e.g., about 4.9) |
| Elemental B | 0.5 to 5 (e.g., about 1.2) |
| Organic Portion | 10 to 30 (e.g., about 17.9) |
| Total | 100.0 |

Thick film conductive ink - Formulation 3
(Theoretical Yield)

| Ingredient | Wt. % |
|---|---|
| Inorganic Portion | |
| Cu powder (Base*) | 40 to 65 (e.g., 58.2) |
| Cu powder #2*** | 10 to 20 (e.g., 14.7) |
| CuO | 3 to 23 (e.g., about 8.2) |
| Elemental B | 0.5 to 5 (e.g., about 1.3) |
| Organic Portion | 10 to 30 (e.g., about 17.6) |
| Total | 100.0 |

Thick film conductive ink - Formulation 4
(Theoretical Yield)

| Ingredient | Wt. % |
|---|---|
| Inorganic Portion | |
| Cu powder (Base*) | 45 to 65 (e.g., 53.9) |
| Cu powder #1** | 5 to 20 (e.g., 9.8) |
| CuO | 3 to 23 (e.g., about 15.2) |
| Elemental B | 0.5 to 5 (e.g., about 3.1) |
| Organic Portion | 10 to 30 (e.g., about 18) |
| Total | 100.0 |

Accordingly, thick film conductive inks for electronic devices, methods for making electronic devices using thick film conductive inks, and electronic devices fabricated by such methods have been described. The exemplary embodiments taught herein provide a thick film conductive ink that includes an organic portion and an inorganic portion. The inorganic portion includes metallic copper powder, cupric oxide, elemental boron, and substantially no glass. The inorganic portion is dispersed in the organic portion to form a paste. In an exemplary embodiment, the thick film conductive ink is deposited overlying a substrate. The thick film conductive ink is dried, and then fired, for example in a furnace, to form a conductor overlying the substrate. The conductor includes fused/sintered metallic copper, cupric oxide, boron trioxide, and substantially no glass.

While at least one embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes may be made in the function and arrangement of elements without departing from the scope of the disclosure as set forth in the appended claims and the legal equivalents thereof.

What is claimed is:

1. A thick film conductive ink for an electronic device, the thick film conductive ink comprising:
an organic portion; and
an inorganic portion dispersed in the organic portion defining a paste, wherein the inorganic portion comprises metallic copper powder, cupric oxide, and elemental boron, and wherein the thick film conductive ink comprises substantially no glass, wherein the metallic copper powder comprises a first copper powder, a second copper powder, and/or a third copper powder, wherein the first copper powder has a first average surface area of from about 0.3 to about 0.8 $m^2/g$, the second copper powder has a second average surface area of from about 0.8 to about 1.5 $m^2/g$, and the third copper powder has a third average surface area of from about 1.5 to about 2.5 $m^2/g$, and wherein the metallic copper powder comprises the first copper powder that has a median particle size of about 4.5 to about 10.5 μm.

2. The thick film conductive ink of claim 1, wherein the inorganic portion comprises substantially no lead.

3. The thick film conductive ink of claim 1, wherein the inorganic portion consists essentially of the metallic copper powder, cupric oxide, and elemental boron.

4. The thick film conductive ink of claim 1, wherein the organic portion is present in an amount of from about 10 to about 30 wt. % of the thick film conductive ink.

5. The thick film conductive ink of claim 1, wherein the inorganic portion is present in an amount of from about 70 to about 90 wt. % of the thick film conductive ink.

6. The thick film conductive ink of claim 1, wherein the metallic copper powder is present in an amount of from about 50 to about 85 wt. % of the thick film conductive ink.

7. The thick film conductive ink of claim 1, wherein cupric oxide is present in an amount of from about 3 to about 23 wt. % of the thick film conductive ink.

8. The thick film conductive ink of claim 1, wherein elemental boron is present in an amount of from about 0.5 to about 5 wt. % of the thick film conductive ink.

9. The thick film conductive ink of claim 1, wherein the organic portion comprises an organic liquid having a boiling point of from about 220 to about 300° C. at 1 atmosphere of pressure.

10. The thick film conductive ink of claim 1, wherein the organic portion comprises 2,2,4-trimethyl-1,3-pentanediol monoisobutyrate.

11. The thick film conductive ink of claim 10, wherein 2,2,4-trimethyl-1,3-pentanediol monoisobutyrate is present in an amount of from about 8 to about 25 wt. % of the thick film conductive ink.

12. The thick film conductive ink of claim 1, wherein the organic portion comprises ethyl cellulose.

13. The thick film conductive ink of claim 12, wherein ethyl cellulose is present in an amount of from about 0.5 to about 3 wt. of the thick film conductive ink.

14. The thick film conductive ink of claim 1, wherein the organic portion comprises butyl diglyme.

15. The thick film conductive ink of claim 14, wherein butyl diglyme is present in an amount of from about 1 to about 4 wt. % of the thick film conductive ink.

16. The thick film conductive ink of claim 1, wherein the metallic copper powder has a median particle size of from about 0.01 to about 10.5 μm.

17. A method for making an electronic device, the method comprising the steps of:
  depositing a thick film conductive ink overlying a substrate, wherein the thick film conductive ink comprises:
    an organic portion; and
    an inorganic portion dispersed in the organic portion defining a paste, wherein the inorganic portion comprises metallic copper powder, cupric oxide, and elemental boron, and wherein the thick film conductive ink comprises substantially no glass, wherein the metallic copper powder comprises a first copper powder, a second copper powder, and/or a third copper powder, wherein the first copper powder has a first average surface area of from about 0.3 to about 0.8 $m^2/g$, the second copper powder has a second average surface area of from about 0.8 to about 1.5 $m^2/g$, and the third copper powder has a third average surface area of from about 1.5 to about 2.5 $m^2/g$, and wherein the metallic copper powder comprises the first copper powder that has a median particle size of about 4.5 to about 10.5 μm; and
  firing the thick film conductive ink to form a conductor overlying the substrate.

18. The method of claim 17, wherein depositing comprises depositing the thick film conductive ink in a single print to form a first conductor paste layer, and wherein firing comprises firing the first conductor paste layer to form the conductor having a single print fired thickness of from about 0.0254 to about 0.1524 mm.

19. An electronic device comprising:
  a substrate; and
  a conductor overlying the substrate and comprising fused/sintered metallic copper, cupric oxide, boron trioxide, and substantially no glass, wherein the metallic copper comprises a first copper powder, a second copper powder, and/or a third copper powder, wherein the first copper powder has a first average surface area of from about 0.3 to about 0.8 $m^2/g$, the second copper powder has a second average surface area of from about 0.8 to about 1.5 $m^2/g$, and the third copper powder has a third average surface area of from about 1.5 to about 2.5 $m^2/g$, and wherein the metallic copper powder comprises the first copper powder that has a median particle size of about 4.5 to about 10.5 μm.

* * * * *